United States Patent
Soumiya

(10) Patent No.: US 12,077,680 B2
(45) Date of Patent: Sep. 3, 2024

(54) POLISHING COMPOSITION, PRODUCTION METHOD OF THE SAME, POLISHING METHOD AND A MANUFACTURING METHOD OF A SEMICONDUCTOR SUBSTRATE

(71) Applicant: FUJIMI INCORPORATED, Aichi (JP)

(72) Inventor: Akiko Soumiya, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 299 days.

(21) Appl. No.: 17/197,246

(22) Filed: Mar. 10, 2021

(65) Prior Publication Data
US 2021/0301174 A1 Sep. 30, 2021

(30) Foreign Application Priority Data
Mar. 24, 2020 (JP) .................................. 2020-053111

(51) Int. Cl.
C09G 1/02 (2006.01)
H01L 21/321 (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 10,283,373 B2 * | 5/2019 | Sakashita | .......... H01L 21/76865 |
| 2011/0062376 A1 * | 3/2011 | Reiss | ................... C09K 3/1463 |
| | | | 252/79.1 |
| 2016/0032461 A1 * | 2/2016 | Singh | ....................... C09G 1/02 |
| | | | 252/79.1 |
| 2017/0275498 A1 * | 9/2017 | Tamada | ............... C09K 3/1463 |
| 2019/0256741 A1 | 8/2019 | Inoue et al. | |
| 2020/0024483 A1 | 1/2020 | Okamoto et al. | |

FOREIGN PATENT DOCUMENTS

| | | |
|---|---|---|
| CN | 109690741 A1 | 4/2019 |
| JP | 1067986 A | 3/1998 |
| JP | 2005244123 A | 9/2008 |
| JP | 2020-017556 A | 1/2020 |
| TW | 202007752 A1 | 2/2020 |

OTHER PUBLICATIONS

Notice of Reasons for Refusal for JP 2020-053111, with a mailing date of Nov. 28, 2023.
Office Action for JP 2020-053111, with a mailing date of Apr. 19, 2024.
Office Action for TW Application No. 110107670, with a mailing date of Jun. 12, 2024.

* cited by examiner

*Primary Examiner* — Roberts P Culbert
(74) *Attorney, Agent, or Firm* — Katten Muchin Rosenman LLP

(57) ABSTRACT

The present invention is to provide means for polishing an object to be polished containing titanium nitride at a high polishing speed. The present invention relates to a polishing composition containing silica particles and a polishing accelerator, wherein the polishing accelerator is a compound having an aromatic heterocyclic ring and an OH group or a group of a salt thereof directly bonded to the aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and the polishing composition is used for polishing an object to be polished containing titanium nitride.

18 Claims, No Drawings

POLISHING COMPOSITION, PRODUCTION METHOD OF THE SAME, POLISHING METHOD AND A MANUFACTURING METHOD OF A SEMICONDUCTOR SUBSTRATE

CROSS-REFERENCE TO RELATED APPLICATION

The entire disclosure of Japanese Patent Application No. 2020-053111, filed on Mar. 24, 2020, is incorporated herein by reference in its entirety.

BACKGROUND

1. Technical Field

The present invention relates to a polishing composition, a production method of the same, a polishing method and a manufacturing method of a semiconductor substrate.

2. Description of Related Arts

In recent years, in accordance with multilayer wiring on a surface of a semiconductor substrate, a so-called chemical mechanical polishing (CMP) technique for polishing and planarizing a semiconductor substrate is used in manufacturing of a device. CMP is a method of planarizing a surface of an object to be polished such as a semiconductor substrate or the like by using a polishing composition (slurry) containing abrasive grains of silica, alumina, ceria, or the like, an anticorrosive, a surfactant, or the like. The object to be polished is, for example, a film containing silicon, polysilicon, silicon oxide, silicon nitride, titanium nitride, titanium, tantalum nitride, tantalum, or the like, a wiring or a plug including a metal such as copper or tungsten, or the like.

In particular, focusing on polishing of titanium nitride, JP H10-67986 A (corresponding to WO 1997/47030 A) discloses that titanium or titanium nitride can be polished by using a polishing composition containing an oxidizing agent, a polishing agent (abrasive grains), and a fluoride-containing additive.

In addition, JP 2005-244123 A (corresponding to US 2005/191,823 A) discloses that titanium or titanium nitride can be polished by using a polishing composition containing 0.1% by mass or more of colloidal silica and water and having a pH of 6.0 or less.

SUMMARY

However, in the technique of JP H10-67986 A (corresponding to WO 1997/47030 A), a polishing speed of titanium nitride is insufficient.

In addition, in the technique of JP 2005-244123 A (corresponding to US 2005/191,823 A), an effect of increasing a polishing speed of titanium is recognized, but a higher polishing speed of titanium nitride is required.

An object of the present invention is to provide means for polishing an object to be polished containing titanium nitride at a high polishing speed.

According to an aspect of the present invention,
a polishing composition contains silica particles and a polishing accelerator,
wherein the polishing accelerator is a compound having an aromatic heterocyclic ring and an OH group or a group of a salt thereof directly bonded to the aromatic heterocyclic ring, or
a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and
the polishing composition is used for polishing an object to be polished containing titanium nitride.

DETAILED DESCRIPTION

Hereinafter, embodiments of the present invention will be described. Note that the present invention is not limited to only the following embodiments. In addition, in the present specification, "X to Y" representing a range means "X or more and Y or less". In addition, unless otherwise specified, operation and measurement of physical properties and the like are performed under conditions of room temperature (a range of 20° C. or higher and 25° C. or lower)/relative humidity of 40% RH or more and 50% RH or less.

<Polishing Composition>

An aspect of the present invention relates to a polishing composition containing silica particles and a polishing accelerator, wherein the polishing accelerator is a compound having an aromatic heterocyclic ring and an OH group or a group of a salt thereof directly bonded to the aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and the polishing composition is used for polishing an object to be polished containing titanium nitride. According to an aspect of the present invention, means for polishing an object to be polished containing titanium nitride at a high polishing speed is provided.

A mechanism by which the above problems can be solved is specifically unclear, but is presumed by the present inventors as follows.

As a method of polishing a specific object to be polished at a high polishing speed, a method of increasing an electrical conductivity is generally known. However, polishing performed at a high electrical conductivity may also accelerate a polishing speed of another material (for example, a stopper film), which may not be desirable from the viewpoint of increasing a selection ratio. However, in the present invention, the polishing accelerator acts to embrittle a Ti—N bond or a Ti—O bond by coordinating an ionized carboxyl group ($COO^-$ group) or an ionized hydroxyl group ($O^-$ group) of the polishing accelerator to titanium nitride which is an object to be polished, thereby accelerating polishing of titanium nitride. Therefore, the polishing composition according to an aspect of the present invention can remarkably increase a polishing speed of an object to be polished containing titanium nitride regardless of a level of the electrical conductivity.

Note that the above mechanism is based on the presumption, and whether it is right or wrong does not affect the technical scope of the present invention.

Hereinafter, each component can be contained in the polishing composition, an object to be polished, and the like will be described.

(Object to be Polished)

The polishing composition according to an embodiment of the present invention is used for polishing an object to be polished containing titanium nitride (TiN). The object to be polished is not particularly limited as long as it has a surface to be polished containing titanium nitride, and a known object to be polished used in the CMP field can be applied. Therefore, an embodiment of the object to be polished is not particularly limited, but a layer which is a flat-plate-like member is preferred, a substrate including the layer is more preferred, and a semiconductor substrate is still more preferred. For example, examples thereof can include a substrate containing a single layer, a substrate containing a layer to be polished and another layer (for example, a support layer or another functional layer), and the like.

In addition, the object to be polished may be an object to be polished that further contains a constituent component containing another material such as a silicon-containing material or a metal or the like in addition to titanium nitride. The silicon-containing material is not particularly limited, and examples thereof can include a material having a silicon-oxygen bond (for example, silicon oxide or the like), a material having a silicon-silicon bond (for example, polysilicon or the like), a material having a silicon-nitrogen bond (for example, silicon nitride or the like), and the like. In addition, the metal is not particularly limited, and examples thereof can include copper, aluminum, hafnium, cobalt, nickel, titanium, tungsten, and alloys thereof, and the like. Examples of the object to be polished can include a film formed of only titanium nitride (titanium nitride film) and the like.

(Polishing Accelerator)

The polishing composition according to an embodiment of the present invention contains a polishing accelerator. The polishing accelerator is a compound having an aromatic heterocyclic ring and an OH group or group of a salt thereof directly bonded to the a aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring. As described above, the polishing accelerator acts to embrittle a Ti—N bond or a Ti—O bond by coordinating an ionized carboxyl group (COO⁻ group) or an ionized hydroxyl group (O⁻ group) of the polishing accelerator to titanium nitride which is an object to be polished, thereby remarkably accelerating a polishing speed of an object to be polished containing titanium nitride.

Here, the aromatic heterocyclic ring refers to an aromatic ring having one or more hetero atoms (for example, nitrogen atoms (N), oxygen atoms (O), phosphorus atoms (P), or sulfur atoms (S)) as a ring-forming atom, and having a carbon atom (C) as a remaining ring-forming atom. The aromatic heterocyclic ring is not particularly limited, but is preferably a monocyclic aromatic heterocyclic ring. In addition, the number of hetero atoms is not particularly limited, but is preferably one or more and three or fewer. The aromatic heterocyclic ring which is a monocyclic and has one or more and three or fewer hetero atoms is not particularly limited, and examples thereof can include a furan ring, a pyrrole ring, a thiophene ring, an imidazole ring, a pyrazole ring, an oxazole ring, an isoxazole ring, a thiazole ring, a pyridine ring, a pyrazine ring, a pyrimidine ring, a pyridazine ring, a 1,2,3-triazine ring, a 1,2,4-triazine ring, a 1,3,5-triazine ring, and the like. Note that a type of the hetero atom is not particularly limited, but is preferably N.

The compound having an aromatic heterocyclic ring and an OH group or a group of a salt thereof directly bonded to the aromatic heterocyclic ring is preferably a compound represented by the following general formula (1), from the viewpoint of increasing a polishing speed of an object to be polished containing titanium nitride.

[Chem. 1]

(1)

In the above general formula (1), Z's are each independently $CR^1$ or N, where one or more and three or fewer Z's are N, and $R_1$'s are each independently selected from the group consisting of a hydrogen atom, an OH group or a group of a salt thereof, and a COOH group or a group of a salt thereof, where at least one $R_1$ is an OH group or a group of a salt thereof.

In the compound represented by the above general formula (1), it is preferable that one Z is N and five Z's are $CR_1$. In addition, when one Z is N and five Z's are $CR_1$, one or two $R_1$'s of the five $R_1$'s are preferably an OH group or a group of a salt thereof, and one $R_1$ of the five $R_1$'s is more preferably an OH group or a group of a salt thereof. In addition, when one Z is N and five Z's are $CR_1$, it is preferable that all $R_1$'s of the five $R_1$'s are not a COOH group or a group of a salt thereof (the compound does not have a COOH group or a group of a salt thereof) or one $R_1$ is a COOH group or a group of a salt thereof, and it is more preferable that one $R_1$ of the five $R_1$'s is COOH group or a group of a salt thereof.

In addition, the aromatic hydrocarbon ring refers to an aromatic ring in which a ring-forming element (a ring-forming atom) is only a carbon atom. The aromatic hydrocarbon ring is not particularly limited, but is more preferably an aromatic hydrocarbon ring having 6 or more and 14 or fewer ring-forming carbon atoms. The aromatic hydrocarbon ring having 6 or more and 14 or fewer ring-forming carbon atoms is not particularly limited, and examples thereof can include a benzene ring, a naphthalene ring, an anthracene ring, a phenalene ring, a phenanthrene ring, and the like. Among them, a benzene ring is preferred, from the viewpoint of further increasing a polishing speed of an object to be polished containing titanium nitride.

The compound having an aromatic hydrocarbon ring, an OH group or a group of a salt thereof directly bonded to the aromatic hydrocarbon ring and a COOH group or a group of a salt thereof directly bonded to the aromatic hydrocarbon ring is preferably a compound represented by the following general formula (2), from the viewpoint of increasing a polishing speed of an object to be polished containing titanium nitride.

[Chem. 2]

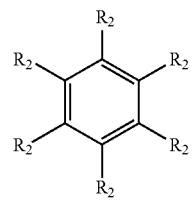

(2)

In the above general formula (2), $R_2$'s are each independently selected from the group consisting of a hydrogen atom, an OH group or a group of a salt thereof, and a COOH group or a group of a salt thereof, where at least one $R_2$ is an OH group or a group of a salt thereof, and at least one $R_2$ is a COOH group or a group of a salt thereof.

In the above general formula (2), one $R_2$ of six $R_2$'S is preferably an OH group or a group of a salt thereof. In addition, one $R_2$ of the six $R_2$'s is preferably a COOH group or a group of a salt thereof.

Note that the COOH group or the group of the salt thereof directly bonded to the aromatic heterocyclic ring or the aromatic hydrocarbon ring in the polishing accelerator is preferably present in the polishing composition in a state of an ionized carboxyl group ($COO^-$ group). In addition, the OH group or the group of the salt thereof directly bonded to the aromatic heterocyclic ring or the aromatic hydrocarbon ring is particularly preferably present in the polishing composition in a state of an ionized hydroxyl group ($O^-$ group).

As described above, as a preferred example, the polishing accelerator is a compound represented by the above general formula (1) or the above general formula (2). Among them, the polishing accelerator is more preferably a compound represented by the above general formula (1) wherein one Z is N, five Z's are $CR_1$, one or two $R_1$'s of five $R_1$'s are an OH group or a group of a salt thereof, one $R_1$ of the five $R_1$'s is a COOH group or a group of a salt thereof or a hydrogen atom, and remaining $R_1$'s of the five $R_1$'s are a hydrogen atom. In addition, the polishing accelerator is more preferably a compound represented by the above general formula (2) wherein one $R_2$ of six $R_2$'s is an OH group or a group of a salt thereof, one $R_2$ of the six $R_2$'s is a COOH group or a group of a salt thereof, and four $R_2$'s of the six $R_2$'S are a hydrogen atom. In addition, the polishing accelerator is still more preferably a compound represented by the above general formula (1) wherein one Z is N, five Z's are $CR_1$, two $R_1$'s of five $R_1$'s are an OH group or a group of a salt thereof, one $R_1$ of the five $R_1$'s is a COOH group or a group of a salt thereof or a hydrogen atom, and two $R_1$'s of the five $R_1$'s a hydrogen atom.

In the compound represented by the above general formula (1), it is preferable that as a positional relation between the N atom and the OH group or the group of the salt thereof, the OH group or the group of the salt thereof is directly bonded to a carbon atom which is a ring-forming atom adjacent to the N atom (the ortho position of the N atom) which is a ring-forming atom. In addition, it is preferable that the OH group or the group of the salt thereof is directly bonded to a carbon atom neighboring to the N atom which is a ring-forming atom with one carbon atom interposed therebetween (That is, it is preferable that the OH group or the group of the salt thereof is directly bonded to a carbon atom which is a ring-forming atom further adjacent to a ring-forming atom (a carbon atom or N atom, preferably a carbon atom) adjacent to the N atom which is a ring-forming atom).

In the compound represented by the above general formula (1) wherein at least one $R_1$ is a COOH group or a group of a salt thereof, as a positional relation between an OH group or a group of a salt thereof and the COOH group or the group of the salt thereof, each of the groups is preferably directly bonded to an adjacent ring-forming atom. In addition, in the compound represented by the above general formula (1) wherein at least one $R_1$ is a COOH group or a group of a salt thereof, as a positional relation between an OH group or a group of a salt thereof and the COOH group or the group of the salt thereof, the COOH group or the group of the salt thereof is preferably directly bonded to a ring-forming atom neighboring to a ring-forming atom directly bonded to the OH group with one ring-forming atom interposed therebetween (That is, the COOH group or the group of the salt thereof is preferably directly bonded to a ring-forming atom further adjacent to a ring-forming atom adjacent to the ring-forming atom directly bonded to the OH group). In addition, in the compound represented by the above general formula (2), as the positional relation, each of the OH group or the group of the salt thereof and the COOH group or the group of the salt thereof is preferably directly bonded to a ring-forming atom (a ring-forming carbon atom) adjacent thereto. Among them, in the compound represented by the above general formula (1) wherein at least one $R_1$ is a COOH group or a group of a salt thereof, the COOH group or the group of the salt thereof is more preferably directly bonded to a ring-forming atom neighboring to a ring-forming atom directly bonded to the OH group with one ring-forming atom interposed therebetween (That is, the COOH group or the group of the salt thereof is more preferably directly bonded to a ring-forming atom further adjacent to a ring-forming atom adjacent to the ring-forming atom directly bonded to the OH group).

Note that the OH group or the group of the salt thereof included in the polishing accelerator is not particularly limited, but the OH group is preferred. In addition, as the COOH group or the group of the salt thereof included in the polishing accelerator is not particularly limited, but the COOH group is preferred.

The polishing accelerator is not particularly limited, and specific examples thereof preferably include 1-hydroxypyridine, 2-hydroxypyridine, 3-hydroxypyridine, 2-hydroxynicotinic acid, 4-hydroxynicotinic acid, 5-hydroxynicotinic acid, 6-hydroxynicotinic acid, 2-hydroxyisonicotinic acid, 3-hydroxyisonicotinic acid, 3-hydroxypicolinic acid, 4-hydroxypicolinic acid, 5-hydroxypicolinic acid, 6-hydroxypicolinic acid, salicylic acid, 3-hydroxybenzoic acid, 4-hydroxybenzoic acid, citrazinic acid, 2,3-dihydroxyisonicotinic acid, 2,5-dihydroxyisonicotinic acid, 3,5-dihydroxyisonicotinic acid, and salts thereof, viewpoint of the effect of increasing a from the polishing speed of an object to be polished containing titanium nitride. Among them, 3-hydroxypyridine, 2-hydroxynicotinic acid, 2-hydroxyisonicotinic acid, citrazinic acid, salicylic acid, or salts thereof is more preferred, 3-hydroxypyridine, 2-hydroxyisonicotinic acid, citrazinic acid, salicylic acid, or salts thereof is still more preferred, 3-hydroxypyridine, 2-hydroxyisonicotinic acid, citrazinic acid, or a salt thereof is further still more preferred, and citrazinic acid or a salt thereof is particularly preferred. Note that in 2-hydroxynicotinic acid, 4-hydroxynicotinic acid, 5-hydroxynicotinic acid, 6-hydroxynicotinic acid, 2-hydroxyisonicotinic acid, 3-hydroxyisonicotinic acid, 3-hydroxypicolinic acid, 4-hydroxypicolinic acid, 5-hydroxypicolinic acid, 6-hydroxypicolinic acid, salicylic acid, 3-hydroxybenzoic acid, 4-hydroxybenzoic acid, citrazinic acid, 2,3-dihydroxyisonicotinic acid, 2,5-dihydroxyisonicotinic acid, and 3,5-dihydroxyisonicotinic acid, a salt compound in which an OH group is a group of a salt or a salt compound in which a COOH group is a group of a salt is also preferred.

An addition amount (concentration) of the polishing accelerator is not particularly limited, but is preferably 0.01 mmol/L or more, more preferably 0.1 mmol/L or more, and still more preferably 1 mmol/L or more, with respect to a total volume of the polishing composition. Within this range, a polishing speed of an object to be polished containing titanium nitride is further increased. The addition amount (concentration) of the polishing accelerator is not particularly limited, but is preferably 100 mmol/L or less, more preferably 50 mmol/L or less, and still more preferably 30 mmol/L or less, with respect to the total volume of the polishing composition. Within this range, the polishing accelerator more effectively acts. The reason is presumed that the electrical conductivity is not excessively increased, and dispersibility of the abrasive grains is further improved.

(Abrasive Grains)

The polishing composition according to an embodiment of the present invention contains a silica abrasive. That is, the polishing composition according embodiment of the present invention contains to an silica particles as abrasive grains. Thus, the polishing composition according to an embodiment of the present invention contains at least one type of silica particles. The abrasive grains act to increase a polishing speed by mechanically polishing an object to be polished.

The silica particles (that is, the type of silica particles) are not particularly limited, is preferably fumed silica or colloidal silica, and more preferably colloidal silica, from the viewpoint of dispersion stability or defect performance. Examples of a production method of colloidal silica can include a sodium silicate method and a sol-gel method. Any colloidal silica produced by any production method is preferably used. However, colloidal silica produced by a sol-gel method is preferred, from the viewpoint of reducing metal impurities. The reason is that colloidal silica produced by a sol-gel method has a small content of metal impurities having a property of being diffused in a semiconductor or corrosive ions such as chloride ions and the like. The production of the colloidal silica by the sol-gel method can be performed using a method known in the related art. Specifically, colloidal silica can be obtained by using a hydrolysable silicon compound (for example, alkoxysilane or a derivative thereof) as a raw material and performing a hydrolysis and condensation reaction.

In addition, surfaces of the silica particles may not be modified or modified. A preferred example of the silica particles can include colloidal silica whose surface is not modified.

A shape of the silica particle is not particularly limited, but may be a spherical shape or a non-spherical shape. Specific examples of the non-spherical shape can include various shapes such as a polygonal prism shape such as a triangular prism, a tetragonal prism, or the like, a cylindrical shape, a straw bag shape in which a central portion of a cylinder is inflated compared to ends, a doughnut shape in which a central portion of a disk is perforated, a plate shape, a so-called cocoon-like shape having a constriction in a middle portion, a so-called associated type spherical shape in which a plurality of particles are integrated, a so-called konpeito shape having a plurality of protrusions on a surface, a rugby ball shape, and the like, but are not limited thereto.

An average primary particle size of the silica particles is not particularly limited, but is preferably 5 nm or more, more preferably 7 nm or more, still more preferably 10 nm or more, and particularly preferably 25 nm or more. Within this range, a polishing speed of an object to be polished containing titanium nitride is increased. In addition, the average primary particle size of the silica particles is not particularly limited, but is preferably 120 nm or less, more preferably 80 nm or less, and still more preferably 50 nm or less. Within this range, a defect occurrence frequency on a polished surface of an object to be polished containing titanium nitride can be reduced. In addition, a polishing efficiency of an object to be polished containing titanium nitride is increased. Note that a value of the average primary particle size of the silica particles can be calculated based on a specific surface area of the silica particles measured by a BET method (BET specific surface area), assuming that the shape of the silica particle is a spherical shape. More specifically, the average primary particle size of the silica particles can be calculated from a specific surface area of the silica particles measured by a BET method using a "Flow Sorb II 2300" (manufactured by Micromeritics Instrument Corporation) and a density of the silica particle.

An average secondary particle size of the silica particles is not particularly limited, but is preferably 10 nm or more, more preferably 20 nm or more, still more preferably 30 nm or more, and particularly preferably 50 nm or more. Within this range, a polishing speed of an object to be polished containing titanium nitride is increased. In addition, the average secondary particle size of the silica particles is not particularly limited, but is preferably 250 nm or less, more preferably 200 nm or less, still more preferably 150 nm or less, and particularly preferably 100 nm or less. Within this range, a defect occurrence frequency on a polished surface of an object to be polished containing titanium nitride can be reduced. In addition, a polishing efficiency of an object to be polished containing titanium nitride is increased. Note that a value of the average secondary particle size of the silica particles can be calculated by, for example, a dynamic light scattering method represented by a laser diffraction scattering method, using a dynamic light scattering particle size and particle size distribution apparatus (UPA-UTI151, manufactured by Nikkiso Co., Ltd.).

The sizes (average primary particle size and average secondary particle size) of the silica particles can be appropriately controlled by a selection of a production method of the silica particles and the like.

Note that the silica particles can be used alone or in combination of two or more.

An addition amount (concentration) of the silica particles is not particularly limited, but is preferably 0.001% by mass or more, more preferably 0.01% by mass or more, and still more preferably 0.1% by mass or more, of the polishing with respect to a total mass composition. Within this range, a contact frequency between the silica particles and the object to be polished is increased, and the polishing speed of the object to be polished is further increased. In addition, the addition amount (concentration) of the silica particles is not particularly limited, but is preferably 30% by mass or less, more preferably 10% by mass or less, and still more preferably 5% by mass or less, with respect to the total mass of the polishing composition. Within this range, a cost is reduced, and aggregation between the silica particles is suppressed, such that the polishing speed of the object to be polished is further increased.

The polishing composition according to an embodiment of the present invention may contain other abrasive grains in addition to the silica particles. The other abrasive grains may be any of inorganic particles other than the silica particles, organic particles, and organic-inorganic composite particles.

Examples of the inorganic particles other than the silica particles can include metal oxide particles such as alumina particles, ceria particles, titania particles, or the like, silicon nitride particles, silicon carbide particles, and boron nitride particles. A specific example of the organic particles can include polymethylmethacrylate (PMMA) particles.

However, in the polishing composition according to an embodiment of the present invention, it is preferable that an addition amount (concentration) of the other abrasive grains is as small as possible, and it is particularly preferable that the other abrasive grains are not substantially contained. Note that in the present specification, "the other abrasive grains are not substantially contained" means a case where the addition amount (concentration) of the other abrasive grains is less than 0.001% by mass with respect to the total mass of the polishing composition.

(Oxidizing Agent)

The polishing composition according to an embodiment of the present invention preferably further contains an oxidizing agent. The oxidizing agent oxides a surface of an object to be polished, and thus acts to improve a polishing characteristic such as an increase in polishing speed of the object to be polished, an improvement of surface quality of an object to be polished after polishing, or the like.

The oxidizing agent is not particularly limited, and examples thereof can include hydrogen peroxide, sodium peroxide, barium peroxide, ozone water, a silver (II) salt, an iron (III) salt, permanganic acid, chromic acid, dichromatic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and salts thereof, and the like. Among them, hydrogen peroxide is preferred, from the viewpoint of handleability and safety. Note that the oxidizing agents can be used alone or in combination of two or more.

An addition amount (concentration) of the oxidizing agent is not particularly limited, but is preferably 0.001% by mass or more, more preferably 0.01% by mass or more, and still more preferably 0.1% by mass or more, with respect to the total mass of the polishing composition. Within this range, an oxidation reaction of titanium nitride is more sufficiently carried out, and the polishing speed of the object to be polished containing titanium nitride is thus increased. In addition, an addition amount (concentration) of the oxidizing agent is not particularly limited, but is preferably 10% by mass or less, more preferably 5% by mass or less, and still more preferably 3% by mass or less, with respect to the total mass of the polishing composition. Within this range, it is possible to reduce the influence of a decrease in concentration of the abrasive grains due to addition of the oxidizing agent and to more preferably maintain the polishing speed of the object to be polished containing titanium nitride.

(pH Adjusting Agent)

The polishing composition according to an embodiment of the present invention preferably further contains a pH adjusting agent. The pH adjusting agent adjusts a pH of the polishing composition to a preferred range so as to improve the chemical polishing effect on a surface to be polished, thereby acting to increase the polishing speed, or to improve dispersibility stability of the polishing composition.

The pH adjusting agent is not particularly limited as long as it is a compound having a pH adjustment function, and examples thereof can include an acid and a basic compound. Here, the basic compound refers to a compound having a function of being dissolved in water to increase a pH of water. The basic compound is added to the polishing composition to be able to act to increase a pH of the polishing composition.

As the acid, either an inorganic acid or an organic acid may be used. The inorganic acid is not particularly limited, and examples thereof can include sulfuric acid, nitric acid, boric acid, carbonic acid, hypophosphorous acid, phosphorous acid, phosphoric acid, and the like. The organic acid is not particularly limited, and examples thereof can include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methyl-hexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and the like.

The basic compound is not particularly limited, and examples thereof can include hydroxide of an alkali metal or a group II element, ammonia, and the like. Specific examples of the hydroxide of an alkali metal can include potassium hydroxide (KOH), sodium hydroxide (NaOH), and the like. Specific examples of the hydroxide of a group II element can include calcium hydroxide ($Ca(OH)_2$) and the like.

Among them, a basic compound is preferred, from the viewpoint of adjusting the pH of the polishing compound to a range of an optimal pH value described below. In addition, hydroxide of an alkali metal or a group II element, or ammonia is more preferred, hydroxide of an alkali metal or a group II element is still more preferred, and hydroxide of an alkali metal is further still more preferred. In addition, potassium hydroxide or sodium hydroxide is particularly preferred, and potassium hydroxide is most preferred.

Note that the pH adjusting agents can be used alone or in combination of two or more.

An addition amount (concentration) of the pH adjusting agent may be appropriately selected so as to have a desired pH value of the polishing composition, and the pH adjusting agent is preferably added so as to have a preferred pH value of the polishing composition described below.

(pH)

The pH of the polishing composition according to an embodiment of the present invention is not particularly limited. However, a lower limit of the pH is preferably 1 or more. Within this range, deterioration of a polishing apparatus or a consumable member such as a polishing pad to be contacted or the like is less likely to occur. Furthermore, a lower limit of the pH more preferably exceeds 7, is still more preferably 8 or more, further still more preferably 9 more, or and particularly preferably 9.5 or more. Within this range, a polishing speed of an object to be polished containing titanium nitride is further increased. The reason is presumed that under the alkali condition in the above range, the carboxyl group or the hydroxyl group in the polishing accelerator is more easily ionized than under an acidic condition, and coordination of the polishing accelerator to titanium nitride is also easily carried out. In addition, an upper limit of the pH is preferably 12 or less, and more preferably 11 or less. Within this range, corrosion is less likely to occur, and the polishing composition can thus be applied to an object to be polished containing various materials which are materials other than titanium nitride. In addition, safety is further improved and handling is more facilitated, such that stability of the polishing composition is further improved. Note that the pH value of the polishing composition can be evaluated by a pH meter (trade name: LAQUA (registered trademark), manufactured by Horiba, Ltd.).

(Electrical Conductivity Adjusting Agent)

The polishing composition according to an embodiment of the present invention preferably further contains an electrical conductivity adjusting agent. The electrical conductivity adjusting agent adjusts an electrical conductivity of the polishing composition to preferred range so as to act to synergistically improve an effect of the polishing accelerator, or to improve the dispersibility stability of the polishing composition. A detailed reason is not clear, but it is presumed that the electrical conductivity is increased by addition of the electrical conductivity adjusting agent, such that an oxidation rate or a degree of oxidation of the titanium element is increased by the oxidizing agent, and an embrittlement film (oxide film) is easily formed.

The electrical conductivity adjusting agent is not particularly limited as long as it is a compound having an electrical conductivity adjusting function, and for example, a salt compound can be used.

Examples of the salt compound can include a salt of an acid, a salt of a basic compound, and the like. Among them, a salt of an acid is preferred as the salt compound. The salt of the acid may be an organic acid salt and an inorganic acid salt, and an inorganic acid salt is more preferred. The inorganic acid salt is not particularly limited, and examples thereof can include nitrate such as potassium nitrate, ammonium nitrate, or the like, phosphate such as diammonium hydrogen phosphate, ammonium dihydrogen phosphate, or the like, and sulfate such as ammonium sulfate or the like. Among them, sulfate is more preferred, and ammonium sulfate is particularly preferred. Note that the salt compound may be the salt of the basic compound described above, the salt of the basic compound is not particularly limited, and examples thereof can include potassium chloride, sodium chloride, potassium bromide, potassium iodide, ammonium citrate, and the like. The salt compounds may be used alone or in combination of two or more.

An addition amount (concentration) of the electrical conductivity adjusting agent may be appropriately selected so as to have a desired electrical conductivity of the polishing composition, and the electrical conductivity adjusting agent is preferably added so as to have a preferred electrical conductivity of the polishing composition described below.

(Electrical Conductivity)

An electrical conductivity (EC) of the polishing composition according to an embodiment of the present invention is not particularly limited. However, a lower limit of the electrical conductivity is preferably 0.1 mS/cm or more, more preferably 0.5 mS/cm or more, and still more preferably 1 mS/cm or more. Within this range, the polishing speed of the titanium nitride film is further increased. The reason is presumed that the electrical conductivity is increased, such that an oxidation rate or a degree of oxidation of the titanium element is increased by the oxidizing agent, and an embrittlement film (oxide film) is easily formed. In addition, an upper limit of the electrical conductivity is preferably less than 10 mS/cm. Within this range, the dispersion stability of the polishing composition is further improved. In addition, an upper limit of the electrical conductivity is more preferably less than 7 mS/cm, still more preferably 6 mS/cm or less, and particularly preferably 5 mS/cm or less. Within this range, the polishing speed of the titanium nitride film can be increased while preferably maintaining the dispersion stability of the abrasive grains. The reason is presumed that the electrical conductivity is not excessively increased and an electric double layer of the abrasive grains is not excessively compressed, and aggregation of the abrasive grains caused by a reduction in repulsive force between the abrasive grains is thus suppressed. From these viewpoints, an example of a preferred range of the electrical conductivity can include a range of 1 mS/cm or more and 6 mS/cm or less. Note that the electrical conductivity of the polishing composition can be evaluated by a desktop electrical conductivity meter (manufactured by Horiba, Ltd., model: DS-71).

Note that the electrical conductivity can be increased, for example, by increasing an addition amount of an acid, a basic compound, or a salt compound thereof. Specifically, the electrical conductivity may be controlled by adjusting an addition amount of each component other than the electrical conductivity adjusting agent, or further adding the electrical conductivity adjusting agent.

(Dispersing Medium)

The polishing composition according to an embodiment of the present invention preferably further contains a dispersing medium (solvent). The dispersing medium acts to disperse or dissolve each component.

The dispersing medium is not particularly limited, but preferably contains water. A content of water in the dispersing medium is not particularly limited, but is preferably 50% by mass or more, and more preferably 90% by mass or more, with respect to a total mass of the dispersing medium, and it is more preferable that only is preferably water. Water is contained water containing as little impurities as possible, and is preferably water in which a total content of a transition metal ion is 100 ppb or less, from the viewpoint of preventing contamination of an object to be cleaned or inhibition of an action of other components. Here, the purity of water can be increased by, for example, a removal of impurity ions using an ion exchange resin, a removal of foreign substances by a filter, and an operation such as distillation or the like. Specifically, it s preferable to use, for example, deionized water (ion exchange water), pure water, ultrapure water, distilled water, and the like, as water.

In addition, in a case where the dispersing medium can improve dispersibility or solubility of each component, the dispersing medium may be an organic solvent or a mixed solvent of water and an organic solvent. The organic solvent is not particularly limited, but a known organic solvent can be used. In the case of the mixed solvent of water and an organic solvent, the organic solvent is preferably miscible with water. In a case where an organic solvent is used, a mixed solvent may be prepared by mixing water and the organic solvent with each other and then each component may be added to and mixed with the mixed solvent, or each component may be dispersed or dissolved in the organic solvent and then mixed with water. Note that the organic solvents can be used alone or in combination of two or more.

(Other Components) The polishing composition according to an embodiment of the present invention may further contain other components within a range in which the effects of the present invention are not impaired. The other components are not particularly limited, but may be appropriately selected from various components used in a known polishing composition, such as a wetting agent, a surfactant, a chelating agent, an antiseptic agent, an antifungal agent, a dissolved gas, a reducing agent, and the like.

<Production Method of Polishing Composition>

Another aspect of the present invention relates to a production method of a polishing composition, the production method including mixing silica particles and a polishing accelerator with each other, wherein the polishing accelerator is a compound having an aromatic heterocyclic ring and an OH group or a group of a salt thereof directly bonded to the aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and the polishing composition is used for polishing an object to be polished containing titanium nitride.

A method of mixing the respective components with each other is not particularly limited, but a known method can be appropriately used. In addition, a mixing temperature is not particularly limited, but is generally preferably 10°C to 40° C., and heating may be performed to increase a rate of dissolution. In addition, a mixing time is also not particularly limited.

Note that in the production method of a polishing composition, preferred embodiments (type, characteristic, structure, addition amount, and the like) of each component are the same as that described for each component of the polishing composition. In addition, various features such as preferred characteristics of a polishing composition to be produced are also the same as that described for the polishing composition.

<Polishing Method>

Still another aspect of the present invention relates to a polishing method of polishing an object to be polished containing titanium nitride by using the polishing composition, or by producing a polishing composition by the production method and using the produced polishing composition.

The object to be polished in the polishing method is the same as that described for the polishing composition.

A polishing apparatus and polishing condition are not particularly limited, but a known apparatus and condition can be appropriately used.

As the polishing apparatus, it is possible to use a general polishing apparatus equipped with a holder for holding an object to be polished, a motor capable of changing a rotation speed, and the like, and having a polishing table to which a polishing pad (polishing cloth) may be attached. As the polishing apparatus, either a one-side polishing apparatus or a double-side polishing apparatus may be used. As the polishing pad, a general nonwoven fabric, polyurethane, a porous fluororesin, or the like can be used without particular limitation. It is preferable that the polishing pad is subjected to groove processing so that a polishing liquid is accumulated therein.

The polishing condition is not particularly limited, but an appropriate condition can be appropriately set depending on characteristics of the polishing composition and the object to be polished. A polishing load (polishing pressure or processing pressure) is not particularly limited, but is generally preferably 0.1 psi or more and 10 psi or less, more preferably 0.5 psi or more and 8 psi or less, and still more preferably 1 psi or more and 6 psi or less, per unit area. Within this range, damage of a substrate due to a load, defects such as scratches on a surface, or the like can be suppressed while implementing a high polishing speed.

Each of a table rotation speed and a carrier rotation speed is not particularly limited, but is generally preferably 10 or more 500 rpm or less, more preferably 20 rpm or more and 300 rpm or less, and still more preferably 30 rpm or more and 200 rpm or less. A method of supplying the polishing composition is also not particularly limited, but a method of continuously supplying (flowing) the polishing composition with a pump or the like may be adopted. A supply amount of the polishing composition (a flow rate of the polishing composition) is not particularly limited as long as it is a supply amount covering the entire object to be polished, but is generally preferably 100 mL/min or more and 5,000 mL/min or less. The polishing time is not particularly limited as long as it is appropriately set to obtain a desired polishing result, but is generally preferably 5 seconds or longer and 180 seconds or shorter. In addition, the polishing is preferably performed using in-situ dressing. Here, the in-situ dressing refers to a technique for dressing a pad with polishing. According to the in-situ dressing, the polishing speed with respect to the polishing time can be more uniformly increased, and controllability of the polishing can be further improved. As an in-situ dressing member, a conditioner such as a diamond dresser or the like is preferred.

The object to be polished after the completion of the polishing may be cleaned with water, and a surface thereof may be dried by removing water droplets attached to the surface thereof by a spin drier, an air blow, or the like.

<Manufacturing Method of Semiconductor Substrate>

Still another aspect of the present invention relates to a manufacturing method of a semiconductor substrate, the method including polishing an object to be polished containing titanium nitride by the polishing method (polishing step). That is, the aspect relates to a manufacturing method of a semiconductor substrate, the manufacturing method including: polishing a substrate material used for forming a semiconductor substrate, which is an object to be polished containing titanium nitride by using the polishing composition, or by producing a polishing composition by the production method and using the produced polishing composition.

Note that in the manufacturing method, steps that can be adopted in a known manufacturing method of a semiconductor substrate can be appropriately adopted as other steps.

Although embodiments of the present invention have been described in detail, however, they are illustrative and exemplary but not restrictive. It is clear that the scope of the present invention should be interpreted by the appended claims.

The present invention includes the following aspects and embodiments, but is not limited thereto:

[1] A polishing composition containing silica particles (at least one type of silica particles) and a polishing accelerator, wherein the polishing accelerator is a compound having an aromatic heterocyclic ring and an OH group or a group of a salt thereof directly bonded to the aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and the polishing composition is used for polishing an object to be polished containing titanium nitride;

[2] The polishing composition according to [1], wherein the polishing accelerator is a compound represented by the following general formula (1) or the following general formula (2),

[Chem. 1]

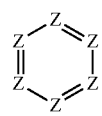

(1)

in the above general formula (1), Z's are each independently $CR_1$ or N, where one or more and three or fewer Z's are N, and $R_1$'s are each independently selected from the group consisting of a hydrogen atom, an OH group or a group of a salt thereof, and a COOH group or a group of a salt thereof, where at least one $R_1$ is an OH group or a group of a salt thereof,

[Chem. 2]

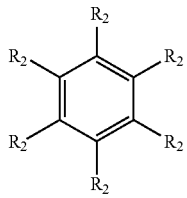

(2)

in the above general formula (2), $R_2$'s are each independently selected from the group consisting of a hydrogen atom, an OH group or a group of a salt thereof, and a COOH group or a group of a salt thereof, where at least one $R_2$ is an OH group or a group of a salt thereof, and at least one $R_2$ is a COOH group or a group of a salt thereof;

[3] The polishing composition according to [2], wherein the polishing accelerator is a compound represented by the general formula (1) wherein one Z is N, five Z's are $CR_1$, where one or two $R_1$'s of five $R_1$'s are an OH group or a group of a salt thereof, one $R_1$ of the five $R_1$'s is a COOH group or a group of a salt thereof, or a hydrogen atom, and remaining $R_1$'s of the five $R_1$'s are a hydrogen atom, or a compound represented by the general formula (2) wherein one $R_2$ of six $R_2$'s is an OH group or a group of a salt thereof, one $R_2$ of the six $R_2$'s is a COOH group or a group of a salt thereof, and four $R_2$'s of the six $R_2$'S are a hydrogen atom;

[4] The polishing composition according to [3], the polishing accelerator is at least one selected from the group consisting of 1-hydroxypyridine, 2-hydroxypyridine, 3-hydroxypyridine, 2-hydroxynicotinic acid, 4-hydroxynicotinic acid, 5-hydroxynicotinic acid, 6-hydroxynicotinic acid, 2-hydroxyisonicotinic acid, 3-hydroxyisonicotinic acid, 3-hydroxypicolinic acid, 4-hydroxypicolinic acid, 5-hydroxypicolinic acid, 6-hydroxypicolinic acid, salicylic acid, 3-hydroxybenzoic acid, 4-hydroxybenzoic acid, citrazinic acid, 2,3-dihydroxyisonicotinic acid, 2,5-dihydroxyisonicotinic acid, 3,5-dihydroxyisonicotinic acid, and salts thereof;

[5] The polishing composition according to any one of [1] to [4], wherein a pH exceeds 7;

[6] The polishing composition according to any one of [1] to [5], wherein an electrical conductivity is 1 mS/cm or more and 6 mS/cm or less;

[7] The polishing composition according to any one of [1] to [6], further containing an inorganic acid salt;

[8] The polishing composition according to any one of [1] to [7], further containing an oxidizing agent;

[9] A production method of a polishing composition, including mixing silica particles (at least one type of silica particles) and a polishing accelerator with each other, wherein the polishing accelerator is a compound having an aromatic heterocyclic ring and an OH group or a group of a salt thereof directly bonded to the aromatic heterocyclic ring, or a compound having an aromatic hydrocarbon ring, an OH group or a group of a salt thereof directly bonded to the aromatic hydrocarbon ring, and a COOH group or a group of a salt thereof directly bonded to the aromatic hydrocarbon ring, and the polishing composition is used for polishing an object to be polished containing titanium nitride;

[10] A polishing method of polishing an object to be polished containing titanium nitride by using the polishing composition according to any one of [1] to [8], or by producing a polishing composition by the production method according to [9] and using the produced polishing composition; and

[11] A manufacturing method of a semiconductor substrate, including polishing a substrate material by the polishing method according to [10], wherein the object to be polished containing titanium nitride is the substrate material.

EXAMPLES

The present invention will be described in more detail with reference to the following Examples and Comparative Examples. However, the technical scope of the present invention is not limited to only the following Examples. Unless otherwise specified, "%" and "part (s)" refer to "% by mass" and "part (s) by mass", respectively. In addition, in the following Examples, unless otherwise specified, operations are performed under a condition of room temperature)(25° C./relative humidity of 40 to 50% RH.

<Preparation of Polishing Composition>

(Polishing Composition 1)

To pure water as a dispersing medium, each of abrasive grains (colloidal silica (unmodified), average primary particle size: 35 nm, average secondary particle size: 66.1 nm), hydrogen peroxide ($H_2O_2$) as an oxidizing agent, 2-hydroxynicotinic acid as a polishing accelerator, ammonium sulfate as an electrical conductivity adjusting agent, and KOH as a pH adjusting agent was added, to prepare a polishing composition 1.

Here, an addition amount of the abrasive grains was 2% by mass with respect to a total mass of the prepared polishing composition. An addition amount of the hydrogen peroxide as an oxidizing agent was 0.12% by mass with respect to the total mass of the prepared polishing composition. Here, the hydrogen peroxide was added using a hydrogen peroxide aqueous solution having a concentration of 31% by mass. The hydrogen peroxide aqueous solution was added in an amount such that the amount of hydrogen peroxide contained therein was the above addition amount. An addition amount of the 2-hydroxynicotinic acid as a polishing accelerator was 10 mmol/L with respect to a total volume of the prepared polishing composition. An addition amount of the KOH as a pH adjusting agent was set so that a pH of the prepared polishing composition was 10.0. An addition amount of the ammonium sulfate as an electrical conductivity adjusting agent was set so that an electrical conductivity of the prepared polishing composition was 5.0 mS/cm.

In addition, a pH of the prepared polishing composition 1 was measured. The pH of the polishing composition 1 (temperature: 25° C.) was measured by a pH meter (trade name: LAQUA (registered trademark), manufactured by Horiba, Ltd.).

Furthermore, an electrical conductivity of a polishing composition prepared in the same manner as that of the preparation of the polishing composition except for no addition of the electrical conductivity adjusting agent (polishing composition without addition of electrical conductivity adjusting agent) was measured. In addition, an electrical conductivity (EC) of the prepared polishing composition 1 (polishing composition after adding electrical conductivity adjusting agent) was measured. The electrical conductivity of the polishing composition (temperature: 25° C.) with or without addition of the electrical conductivity adjusting agent was measured by a desktop electrical conductivity meter (manufactured by Horiba, Ltd., model: DS-71).

<Evaluation>
(Measurement of Polishing Speed)

The object to be polished was polished by using each polishing composition, and a polishing speed (Å/min) of the TiN film was measured. The polishing speed of the TiN film was determined by dividing a difference in the thickness (Å) of the TiN blanket wafer (30 mm×30 before and after polishing measured using a sheet resistance measuring device based on a DC-four probe method by the polishing time (min). Here, 1 Å is 0.1 nm. The evaluation results are shown in Table 1.

TABLE 1

Preparation and evaluation result of each polishing composition

| | Polishing accelerator or comparative compound | | Abrasive grains (colloidal silica) Concentration [% by mass] | Oxidizing agent ($H_2O_2$) Concentration [% by mass] | pH adjusting agent Type | pH | Electrical conductivity adjusting agent Type | EC | | TiN polishing speed [Å/min] | Reference |
|---|---|---|---|---|---|---|---|---|---|---|---|
| Polishing composition | Type | Concentration [mmol/L] | | | | | | Without addition of electrical conductivity adjusting agent [mS/cm] | After addition of electrical conductivity adjusting agent [mS/cm] | | |
| 1 | 2-Hydroxy-nicotinic acid | 10 | 2 | 0.12 | KOH | 10.0 | Ammonium sulfate | 1.7 | 5.0 | 1632 | Example |
| 2 | Citrazinic acid | 10 | 2 | 0.12 | KOH | 10.0 | Ammonium sulfate | 2.6 | 5.0 | 1819 | Example |
| 3 | 2-Hydroxy-isonicotinic acid | 10 | 2 | 0.12 | KOH | 10.0 | Ammonium sulfate | 1.5 | 5.0 | 1776 | Example |
| 4 | Salicylic acid | 10 | 2 | 0.12 | KOH | 10.0 | Ammonium sulfate | 1.5 | 5.0 | 1742 | Example |
| 5 | 3-Hydroxy-pyridine | 10 | 2 | 0.12 | KOH | 10.0 | Ammonium sulfate | 1.5 | 5.0 | 1785 | Example |
| 6 | None | 0 | 2 | 0.12 | KOH | 10.0 | Ammonium sulfate | Undetermined | 5.0 | 1300 | Comparative Example |
| 7 | Nicotinic acid | 10 | 2 | 0.12 | KOH | 10.0 | Ammonium sulfate | 1.5 | 5.0 | 1307 | Comparative Example |

(Polishing Compositions 2 to 7)

Each polishing composition was prepared in the same manner as that of the polishing composition 1, except that a type and addition amount (concentration) of each component were changed as shown in Table 1.

<Polishing Method>

(Polishing Apparatus and Polishing Condition)

A surface of an object to be polished was polished by using each of the prepared polishing compositions by the following apparatus under the following conditions. As an object to be polished, a TiN blanket wafer which was a TiN film (titanium nitride film) having a thickness of 2,500 Å formed on a substrate surface was used.

[Polishing Apparatus and Polishing Condition]

Polishing apparatus: EJ-380IN-CH (manufactured by Engis Japan Corporation)

Polishing pad: IC1010 (manufactured by Nitta Haas Inc. (current: NITTA DuPont Incorporated.))

Polishing pressure (processing pressure): 2.25 psi (1 psi=6,894.76 Pa)

Rotation speed of polishing table: 60 rpm (60 rpm=1 s$^{-1}$)

Supply amount of polishing composition: 100 mL/min

Polishing time: 30 sec

Conditioner (In-situ dressing member): diamond dresser (SDT-100, manufactured by Noritake Co., Limited)

From the results shown in Table 1, it was confirmed that in the case of the polishing compositions 1 to 5 according to Examples in which the polishing accelerator of the present invention was contained, the polishing speed of the TiN film was remarkably high.

On the other hand, it was confirmed that in the case of the polishing composition 6 according to Comparative Example in which the polishing accelerator was not contained, and the polishing composition 7 according to Comparative Example in which a comparative compound having a structure different from that of the polishing accelerator of the present invention was contained, the polishing speed of the TiN film was deteriorated as compared with the polishing compositions 1 to 5 according to Examples.

The present application is based on the Japanese patent application No. 2020-053111 filed on Mar. 24, 2020, and a disclosed content thereof is incorporated herein as a whole by reference.

What is claimed is:

1. A polishing composition comprising silica particles, an oxidizing agent and a polishing accelerator,
   wherein the polishing accelerator is a compound having an aromatic heterocyclic ring and an OH group or a group of a salt thereof directly bonded to the aromatic heterocyclic ring, wherein the aromatic heterocyclic ring is a monocyclic aromatic heterocyclic ring; and the polishing composition has a pH exceeding 7 and is used for polishing an object to be polished containing titanium nitride.

2. The polishing composition according to claim 1, wherein the polishing accelerator is a compound represented by the following general formula (1):

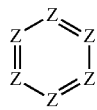 (1)

in the above general formula (1), Z's are each independently $CR_1$ or N,
where one or more and three or fewer Z's are N, and
$R_1$'s are each independently selected from the group consisting of a hydrogen atom, an OH group or a group of a salt thereof, and a COOH group or a group of a salt thereof,
where at least one $R_1$ is an OH group or a group of a salt thereof.

3. The polishing composition according to claim 2, wherein the polishing accelerator is a compound represented by the general formula (1) wherein one Z is N, five Z's are $CR_1$, where one or two $R_1$'s of five $R_1$'s are an OH group or a group of a salt thereof, one $R_1$ of the five $R_1$'s is a COOH group or a group of a salt thereof, or a hydrogen atom, and remaining $R_1$'s of the five $R_1$'s are a hydrogen atom.

4. The polishing composition according to claim 3, wherein the polishing accelerator is at least one selected from the group consisting of 2-hydroxypyridine, 3-hydroxypyridine, 2-hydroxynicotinic acid, 4-hydroxynicotinic acid, 5-hydroxynicotinic acid, 6-hydroxynicotinic acid, 2-hydroxyisonicotinic acid, 3-hydroxyisonicotinic acid, 3-hydroxypicolinic acid, 4-hydroxypicolinic acid, 5-hydroxypicolinic acid, 6-hydroxypicolinic acid, citrazinic acid, 2,3-dihydroxyisonicotinic acid, 2,5-dihydroxyisonicotinic acid, 3,5-dihydroxyisonicotinic acid, and salts thereof.

5. The polishing composition according to claim 1, wherein an electrical conductivity is 1 mS/cm or more and 6 mS/cm or less.

6. The polishing composition according to claim 1, further comprising an inorganic acid salt.

7. The polishing composition according to claim 6, wherein the inorganic acid salt is selected from the group consisting of a nitrate salt, a phosphate salt, and a sulfate salt.

8. The polishing composition according to claim 7, wherein the inorganic acid salt is selected from the group consisting of potassium nitrate, ammonium nitrate, diammonium hydrogen phosphate, ammonium dihydrogen phosphate and ammonium sulfate.

9. A polishing method of polishing an object to be polished containing titanium nitride by using the polishing composition according to claim 1.

10. A manufacturing method of a semiconductor substrate, comprising polishing a substrate material by the polishing method according to claim 9,
wherein the object to be polished containing titanium nitride is the substrate material.

11. The polishing composition according to claim 8, wherein the oxidizing agent is hydrogen peroxide and is present at a concentration of 0.1% by mass or more, with respect to the total mass of the polishing composition.

12. The polishing composition according to claim 11, wherein the oxidizing agent is present at a concentration of 10% by mass or less, with respect to the total mass of the polishing composition.

13. The polishing composition according to claim 1, wherein the aromatic heterocyclic ring contains one or more and three or fewer heteroatoms.

14. The polishing composition according to claim 1, wherein the aromatic heterocyclic ring is an aromatic ring having one or more nitrogen atoms.

15. A production method of a polishing composition, comprising mixing silica particles, an oxidizing agent and a polishing accelerator with each other,
the polishing accelerator is a compound having an aromatic heterocyclic ring and an OH group or a group of a salt thereof directly bonded to the aromatic heterocyclic ring, wherein the aromatic heterocyclic ring is a monocyclic aromatic heterocyclic ring; and
the polishing composition has a pH exceeding 7 and is used for polishing an object to be polished containing titanium nitride.

16. The method according to claim 15, further comprising mixing an inorganic acid salt with the silica particles, the oxidizing agent and polishing accelerator.

17. The method according to claim 16, wherein the inorganic salt is selected from the group consisting of a nitrate salt, a phosphate salt, and a sulfate salt.

18. The method of claim 16, wherein the inorganic salt is selected from the group consisting of potassium nitrate, ammonium nitrate, diammonium hydrogen phosphate, ammonium dihydrogen phosphate and ammonium sulfate.

* * * * *